United States Patent
Kemper et al.

(10) Patent No.: US 9,477,158 B2
(45) Date of Patent: Oct. 25, 2016

(54) LITHOGRAPHIC APPARATUS AND DEVICE MANUFACTURING METHOD

(75) Inventors: Nicolaas Rudolf Kemper, Eindhoven (NL); Marcel Beckers, Eindhoven (NL); Stefan Philip Christiaan Belfroid, Delft (NL); Ferdy Migchelbrink, Veldhoven (NL); Sergei Shulepov, Eindhoven (NL)

(73) Assignee: ASML NETHERLANDS B.V., Veldhoven (NL)

(*) Notice: Subject to any disclaimer, the term of this patent is extended or adjusted under 35 U.S.C. 154(b) by 761 days.

(21) Appl. No.: 11/404,101

(22) Filed: Apr. 14, 2006

(65) Prior Publication Data

US 2007/0242243 A1 Oct. 18, 2007

(51) Int. Cl.
*G03F 7/20* (2006.01)

(52) U.S. Cl.
CPC ......... *G03F 7/70341* (2013.01); *G03F 7/2041* (2013.01); *G03F 7/709* (2013.01); *G03F 7/70808* (2013.01); *G03F 7/70858* (2013.01); *G03F 7/70933* (2013.01)

(58) Field of Classification Search
CPC .......... G03F 7/70808; G03F 7/70341; G03F 7/70858; G03F 7/2041; G03F 7/709; G03F 7/70933
USPC ........................ 355/53, 30, 55, 72
See application file for complete search history.

(56) References Cited

U.S. PATENT DOCUMENTS

| | | | |
|---|---|---|---|
| 3,573,975 A | 4/1971 | Dhaka et al. | 117/212 |
| 3,648,587 A | 3/1972 | Stevens | 95/44 |
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,405,701 A | 9/1983 | Banks et al. | 430/5 |
| 4,480,910 A | 11/1984 | Takanashi et al. | 355/30 |
| 4,509,852 A | 4/1985 | Tabarelli et al. | |
| 5,040,020 A | 8/1991 | Rauschenbach et al. | 355/53 |
| 5,121,256 A | 6/1992 | Corle et al. | 359/664 |
| 5,610,683 A | 3/1997 | Takahashi | 355/53 |
| 5,715,039 A | 2/1998 | Fukuda et al. | 355/53 |
| 5,825,043 A | 10/1998 | Suwa | 250/548 |
| 5,900,354 A | 5/1999 | Batchelder | 430/395 |
| 6,191,429 B1 | 2/2001 | Suwa | 250/548 |
| 6,236,634 B1 | 5/2001 | Lee et al. | 369/112 |

(Continued)

FOREIGN PATENT DOCUMENTS

| | | |
|---|---|---|
| DE | 206 607 | 2/1984 |
| DE | 221 563 | 4/1985 |

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner* — Bao-Luan Le
(74) *Attorney, Agent, or Firm* — Pillsbury Winthrop Shaw Pittman LLP

(57) ABSTRACT

A plurality of extraction conduits are provided to remove immersion liquid into a chamber. The extraction conduits are arranged at different distances from a target portion of the substrate. From the chamber, a passage is provided to which a suction force is applied. When all the conduits are filled with immersion liquid, the extraction capacity will be greater than when one or more of the conduits comprise gas.

20 Claims, 4 Drawing Sheets

(56) References Cited

U.S. PATENT DOCUMENTS

| | | | |
|---|---|---|---|
| 6,600,547 B2 | 7/2003 | Watson et al. | 355/30 |
| 6,603,130 B1 | 8/2003 | Bisschops et al. | 250/492.1 |
| 7,038,760 B2* | 5/2006 | Mulkens et al. | 355/30 |
| 7,057,701 B2* | 6/2006 | Chibana et al. | 355/30 |
| 7,075,616 B2* | 7/2006 | Derksen et al. | 355/30 |
| 7,119,874 B2* | 10/2006 | Cox et al. | 355/30 |
| 7,251,013 B2* | 7/2007 | Ten Kate et al. | 355/30 |
| 7,291,569 B2* | 11/2007 | Goodwin et al. | 438/800 |
| 7,304,715 B2* | 12/2007 | Cadee et al. | 355/30 |
| 7,362,412 B2* | 4/2008 | Holmes et al. | 355/30 |
| 7,372,541 B2* | 5/2008 | Lof et al. | 355/53 |
| 7,388,648 B2* | 6/2008 | Lof et al. | 355/53 |
| 7,394,521 B2* | 7/2008 | Van Santen et al. | 355/30 |
| 7,397,533 B2* | 7/2008 | Verhagen et al. | 355/53 |
| 7,403,261 B2* | 7/2008 | Jansen et al. | 355/30 |
| 7,411,654 B2* | 8/2008 | Beckers et al. | 355/53 |
| 7,414,699 B2* | 8/2008 | Belfroid et al. | 355/30 |
| 7,433,015 B2* | 10/2008 | Mulkens et al. | 355/30 |
| 7,433,016 B2* | 10/2008 | Streefkerk et al. | 355/53 |
| 7,436,486 B2* | 10/2008 | Hirukawa | 355/53 |
| 7,446,851 B2* | 11/2008 | Hirukawa | 355/30 |
| 7,471,371 B2* | 12/2008 | Kameyama | 355/30 |
| 7,474,379 B2* | 1/2009 | Donders et al. | 355/53 |
| 7,480,029 B2* | 1/2009 | Hara | 355/53 |
| 2002/0020821 A1 | 2/2002 | Van Santen et al. | 250/492 |
| 2002/0163629 A1 | 11/2002 | Switkes et al. | 355/53 |
| 2003/0123040 A1 | 7/2003 | Almogy | 355/69 |
| 2004/0000627 A1 | 1/2004 | Schuster | 250/201.2 |
| 2004/0075895 A1 | 4/2004 | Lin | 359/380 |
| 2004/0114117 A1 | 6/2004 | Bleeker | 355/53 |
| 2004/0119954 A1 | 6/2004 | Kawashima et al. | 355/30 |
| 2004/0125351 A1 | 7/2004 | Krautschik | 355/53 |
| 2004/0136494 A1 | 7/2004 | Lof et al. | |
| 2004/0160582 A1 | 8/2004 | Lof et al. | 355/30 |
| 2004/0165159 A1 | 8/2004 | Lof et al. | 355/30 |
| 2004/0207824 A1* | 10/2004 | Lof et al. | 355/30 |
| 2004/0211920 A1* | 10/2004 | Maria Derksen et al. | 250/492.1 |
| 2004/0239954 A1 | 12/2004 | Bischoff | 356/635 |
| 2004/0263809 A1 | 12/2004 | Nakano | 355/30 |
| 2005/0007569 A1 | 1/2005 | Streefkerk et al. | 355/30 |
| 2005/0018155 A1* | 1/2005 | Cox et al. | 355/30 |
| 2005/0024609 A1 | 2/2005 | De Smit et al. | 355/18 |
| 2005/0030496 A1* | 2/2005 | Chibana et al. | 355/30 |
| 2005/0030497 A1 | 2/2005 | Nakamura | 355/30 |
| 2005/0046813 A1 | 3/2005 | Streefkerk et al. | 355/30 |
| 2005/0046934 A1 | 3/2005 | Ho et al. | 359/380 |
| 2005/0052632 A1 | 3/2005 | Miyajima | 355/53 |
| 2005/0094116 A1 | 5/2005 | Flagello et al. | 355/53 |
| 2005/0094125 A1 | 5/2005 | Arai | 355/72 |
| 2005/0122505 A1 | 6/2005 | Miyajima | 355/72 |
| 2005/0128445 A1* | 6/2005 | Hoogendam et al. | 355/30 |
| 2005/0132914 A1 | 6/2005 | Mulkens et al. | 101/463.1 |
| 2005/0134817 A1 | 6/2005 | Nakamura | 355/53 |
| 2005/0140948 A1 | 6/2005 | Tokita | 355/30 |
| 2005/0146693 A1 | 7/2005 | Ohsaki | 355/30 |
| 2005/0146694 A1 | 7/2005 | Tokita | 355/30 |
| 2005/0151942 A1 | 7/2005 | Kawashima | 355/30 |
| 2005/0179877 A1* | 8/2005 | Mulkens et al. | 355/30 |
| 2005/0200815 A1 | 9/2005 | Akamatsu | 353/53 |
| 2005/0213065 A1 | 9/2005 | Kitaoka | 355/53 |
| 2005/0213066 A1 | 9/2005 | Sumiyoshi | 355/53 |
| 2005/0219489 A1 | 10/2005 | Nei et al. | 355/53 |
| 2005/0225734 A1* | 10/2005 | De Smit et al. | 355/30 |
| 2005/0225738 A1* | 10/2005 | Shirai | 355/30 |
| 2005/0233081 A1 | 10/2005 | Tokita | 427/256 |
| 2005/0259234 A1* | 11/2005 | Hirukawa et al. | 355/53 |
| 2005/0263068 A1 | 12/2005 | Hoogendam et al. | |
| 2006/0012765 A1* | 1/2006 | Kameyama | 355/53 |
| 2006/0023189 A1* | 2/2006 | Lof et al. | 355/53 |
| 2006/0033892 A1* | 2/2006 | Cadee et al. | 355/30 |
| 2006/0061739 A1* | 3/2006 | Hoogendam et al. | 355/30 |
| 2006/0072088 A1* | 4/2006 | Lipson et al. | 355/53 |
| 2006/0087630 A1 | 4/2006 | Kemper et al. | 355/30 |
| 2006/0103816 A1* | 5/2006 | Belfroid et al. | 355/30 |
| 2006/0119820 A1* | 6/2006 | Hirukawa | 355/53 |
| 2006/0126037 A1* | 6/2006 | Jansen et al. | 355/30 |
| 2006/0126043 A1* | 6/2006 | Mizutani et al. | 355/53 |
| 2006/0126045 A1* | 6/2006 | Ono et al. | 355/53 |
| 2006/0132736 A1* | 6/2006 | Nagasaka et al. | 355/53 |
| 2006/0132738 A1* | 6/2006 | Hirukawa | 355/53 |
| 2006/0164615 A1* | 7/2006 | Hirukawa | 355/53 |
| 2006/0164617 A1* | 7/2006 | Nagahashi | 355/53 |
| 2006/0221315 A1* | 10/2006 | Beckers et al. | 355/30 |
| 2006/0232756 A1* | 10/2006 | Lof et al. | 355/30 |
| 2006/0250588 A1* | 11/2006 | Brandl | 355/30 |
| 2006/0250590 A1* | 11/2006 | Streefkerk et al. | 355/53 |
| 2006/0290909 A1* | 12/2006 | Donders et al. | 355/53 |
| 2007/0019172 A1* | 1/2007 | Benson | 355/53 |
| 2007/0081133 A1* | 4/2007 | Kayama et al. | 355/53 |
| 2007/0216883 A1* | 9/2007 | Quaedackers et al. | 355/53 |
| 2007/0243329 A1* | 10/2007 | De Graaf | 427/256 |
| 2008/0002170 A1* | 1/2008 | Gellrich et al. | 355/55 |
| 2008/0094590 A1* | 4/2008 | Coon | 355/30 |
| 2008/0316445 A1* | 12/2008 | Watson et al. | 355/53 |
| 2009/0002654 A1* | 1/2009 | Warrick et al. | 355/30 |
| 2009/0126565 A1* | 5/2009 | Cooper et al. | 95/28 |

FOREIGN PATENT DOCUMENTS

| | | | |
|---|---|---|---|
| DE | 224 448 | 7/1985 | |
| DE | 242 880 | 2/1987 | |
| EP | 0023231 | 2/1981 | |
| EP | 0418427 | 3/1991 | |
| EP | 1039511 | 9/2000 | |
| EP | 1 420 300 A2 | 5/2004 | |
| EP | 1524558 A1 * | 4/2005 | G03F 7/20 |
| EP | 1 420 300 A3 | 8/2005 | |
| FR | 2474708 | 7/1981 | |
| JP | 58-202448 | 11/1983 | |
| JP | 62-065326 | 3/1987 | |
| JP | 62-121417 | 6/1987 | |
| JP | 63-157419 | 6/1988 | |
| JP | 04-305915 | 10/1992 | |
| JP | 04-305917 | 10/1992 | |
| JP | 06-124873 | 5/1994 | |
| JP | 07-132262 | 5/1995 | |
| JP | 07-220990 | 8/1995 | |
| JP | 10-228661 | 8/1998 | |
| JP | 10-255319 | 9/1998 | |
| JP | 10-303114 | 11/1998 | |
| JP | 10-340846 | 12/1998 | |
| JP | 11-176727 | 7/1999 | |
| JP | 2000-058436 | 2/2000 | |
| JP | 2001-091849 | 4/2001 | |
| JP | 2004-193252 | 7/2004 | |
| JP | 2005-167211 A | 6/2005 | |
| JP | 2005-223315 A | 8/2005 | |
| JP | 2005-353820 A | 12/2005 | |
| WO | 99/49504 | 9/1999 | |
| WO | WO 2004/053596 A2 | 6/2004 | |
| WO | WO 2004/053950 A1 | 6/2004 | |
| WO | WO 2004/053951 A1 | 6/2004 | |
| WO | WO 2004/053952 A1 | 6/2004 | |
| WO | WO 2004/053953 A1 | 6/2004 | |
| WO | WO 2004/053954 A1 | 6/2004 | |
| WO | WO 2004/053955 A1 | 6/2004 | |
| WO | WO 2004/053956 A1 | 6/2004 | |
| WO | WO 2004/053957 A1 | 6/2004 | |
| WO | WO 2004/053958 A1 | 6/2004 | |
| WO | WO 2004/053959 A1 | 6/2004 | |
| WO | WO 2004/055803 A1 | 7/2004 | |
| WO | WO 2004/057589 A1 | 7/2004 | |
| WO | WO 2004/057590 A1 | 7/2004 | |
| WO | WO 2004-086468 | 10/2004 | |
| WO | WO 2004/090577 | 10/2004 | |
| WO | WO 2004/090633 | 10/2004 | |
| WO | WO 2004/090634 | 10/2004 | |
| WO | WO 2004/092830 | 10/2004 | |
| WO | WO 2004/092833 | 10/2004 | |
| WO | WO 2004/093130 | 10/2004 | |
| WO | WO 2004/093159 | 10/2004 | |
| WO | WO 2004/093160 | 10/2004 | |
| WO | WO 2004/095135 | 11/2004 | |

(56) References Cited

FOREIGN PATENT DOCUMENTS

| WO | WO 2005/010611 | 2/2005 |
|---|---|---|
| WO | 2005/029559 A1 | 3/2005 |
| WO | WO 2005/024517 | 3/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths to Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future Fab International, vol. 15, Jul. 11, 2003.
H. Kawata et al., "Fabrication of 0.2μm Fine Patterns Using Optical Projection Lithography with an Oil Immersion Lens", Jpn. J. Appl. Phys. vol. 31 (1992), pp. 4174-4177.
G. Owen et al., "1/8μm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $\kappa_3$ coefficient in nonparaxial $NA$ scaling equations for resolution, depth of focus, and immersion lithography, *J. Microlith., Microfab., Microsyst.* 1(1):7-12 (2002).
Translation of Notice of Reasons for Rejection for Japanese Patent Application No. 2007-098992 dated Apr. 21, 2010.

* cited by examiner

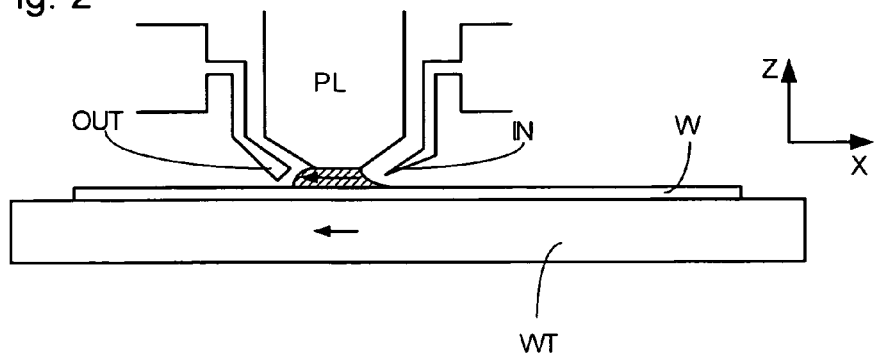
Fig. 2
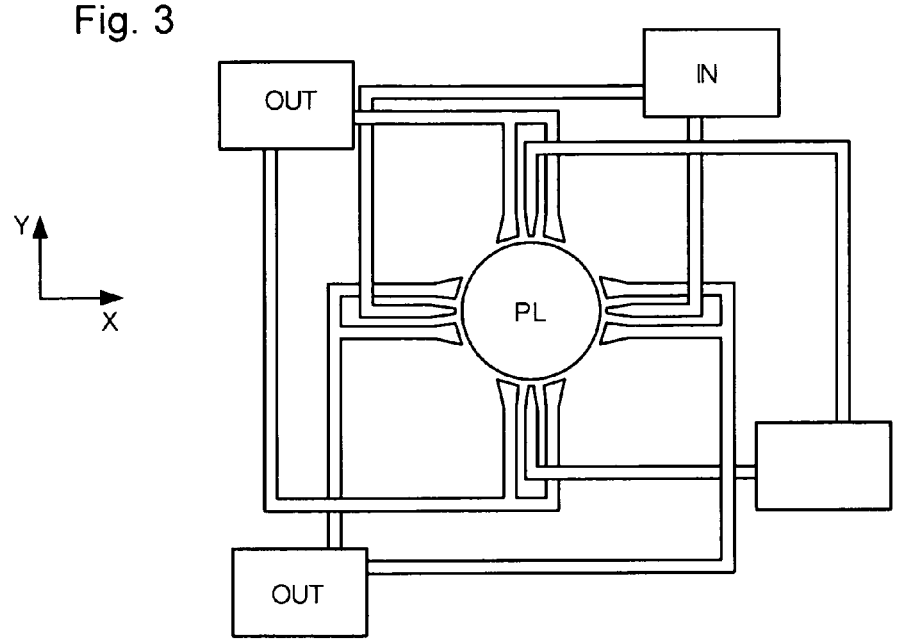
Fig. 3
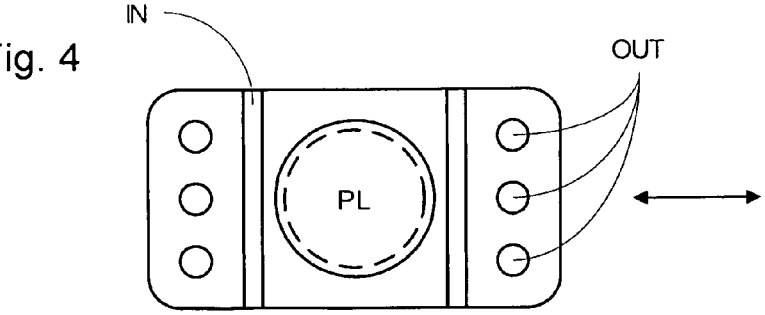
Fig. 4
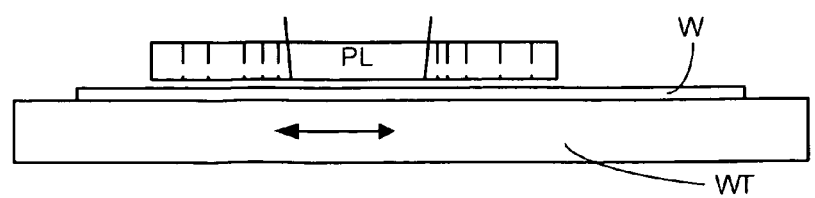

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between a final element of the projection system and the substrate. The point of this is to enable imaging of smaller features since the exposure radiation will have a shorter wavelength in the liquid. (The effect of the liquid may also be regarded as increasing the effective numerical aperture or NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852) means that there is a significant body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent publication WO 99/49504. As illustrated in FIGS. 2 and 3 of the accompanying drawings, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another immersion lithography solution with a localized liquid supply system solution which has been proposed is to provide the liquid supply system with a barrier member which extends along at least a part of a boundary of the space between the final element of the projection system and the substrate table. Such a solution is illustrated in FIG. 5. The barrier member is substantially stationary relative to the projection system in the XY plane though there may be some relative movement in the Z direction (in the direction of the optical axis). In an embodiment, a seal is formed between the barrier member and the surface of the substrate and may be a contactless seal such as a gas seal.

The barrier member 12 at least partly contains liquid in the space 11 between a final element of the projection system PL and the substrate W. A contactless seal 16 to the substrate may be formed around the image field of the projection system so that liquid is confined within the space between the substrate surface and the final element of the projection system. The space is at least partly formed by the barrier member 12 positioned below and surrounding the final element of the projection system PL. Liquid is brought into the space below the projection system and within the barrier member 12 by liquid inlet 13 and may be removed by liquid outlet 13. The barrier member 12 may extend a little above the final element of the projection system and the liquid level rises above the final element so that a buffer of liquid is provided. The barrier member 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas, provided under pressure via inlet 15 to the gap between barrier member 12 and substrate and extracted via outlet 14. The overpressure on the gas inlet 15, vacuum level on the outlet 14 and geometry of the gap are arranged so that there is a high-velocity gas flow inwards that confines the liquid. Those inlets/outlets may be annular grooves which surround the space 11 and the flow of gas 16 is effective to contain the liquid in the space 11. Such a system is disclosed in United States patent application publication no. US 2004-0207824, hereby incorporated in its entirety by reference.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

SUMMARY

In an example immersion lithographic apparatus, the level of the liquid in the space between the barrier member, the final element of the projection system and the substrate is controlled using a plurality of parallel openings in the periphery of the barrier member surrounding the space, all at substantially the same height. However, the extraction capacity of such an arrangement is independent of the level of the immersion liquid to be controlled which may lead to an undesirable variation in the level of immersion liquid.

An active control system has been proposed in which the level of the immersion liquid is measured and the extraction controlled accordingly. However, such a system may require complicated parts and may be susceptible to errors or damage.

It is desirable, for example, to provide a system to remove immersion liquid which can control the level of the immersion liquid in the space between the barrier member, the final element of the projection system and the substrate.

According to an aspect of the invention, there is provided a lithographic apparatus, comprising:

a projection system configured to project a patterned beam of radiation into an image field, the image field having a center;

a substrate table constructed to position a target portion of a substrate in the image field;

a barrier member configured to extend along at least part of a space between the projection system and the substrate, the barrier member comprising a liquid supply system constructed to supply the space with liquid; and a liquid extraction system, comprising:

a passage configured to be subjected to an under pressure or suction flow, and a plurality of conduits connected between the passage and the space to remove liquid, the conduits arranged at different distances from the center of the image field.

According to an aspect of the invention there is provided a device manufacturing method, comprising:

projecting a projection beam of radiation using a projection system into an image field having a center;

placing a target portion of a substrate in the image field;

supplying liquid to a space between the projection system and the substrate; and providing suction to remove liquid from the space, the suction operating through a plurality of conduits, arranged at different distances from the center of the image field, connected to a passage.

projecting a projection beam of radiation into an image field having a center using a projection system having a central optical axis;

placing a target portion of a substrate in the image field;

supplying immersion liquid to a space between a final element of the projection system and the substrate;

providing suction to remove the immersion liquid; and wherein the suction operates through a plurality of conduits connected to a passage, the conduits being arranged at different distances from the center of the image field.

According to an aspect of the invention there is provided a lithographic projection apparatus, comprising:

a projection system configured to project a patterned beam of radiation into an image field;

a substrate table constructed to position a target portion of a substrate in the image field;

a barrier member configured to extend along at least part of a space between the projection system and the substrate, the barrier member comprising a liquid supply system constructed to supply the space with liquid; and a liquid extraction system, comprising:

a passage configured to be subjected to an under pressure or suction flow; and a plurality of conduits connected between the passage and the space to remove liquid, the conduits arranged at different heights relative to the image field.

According to an aspect of the invention there is provided a device manufacturing method, comprising:

projecting a projection beam of radiation onto a target portion of a substrate using a projection system;

supplying liquid to a space between the projection system and the substrate;

providing suction to remove liquid, the suction operating through a plurality of conduits, arranged at different heights, connected to a passage.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts a further liquid supply system for use in a lithographic projection apparatus;

DETAILED DESCRIPTION

Figure 1:
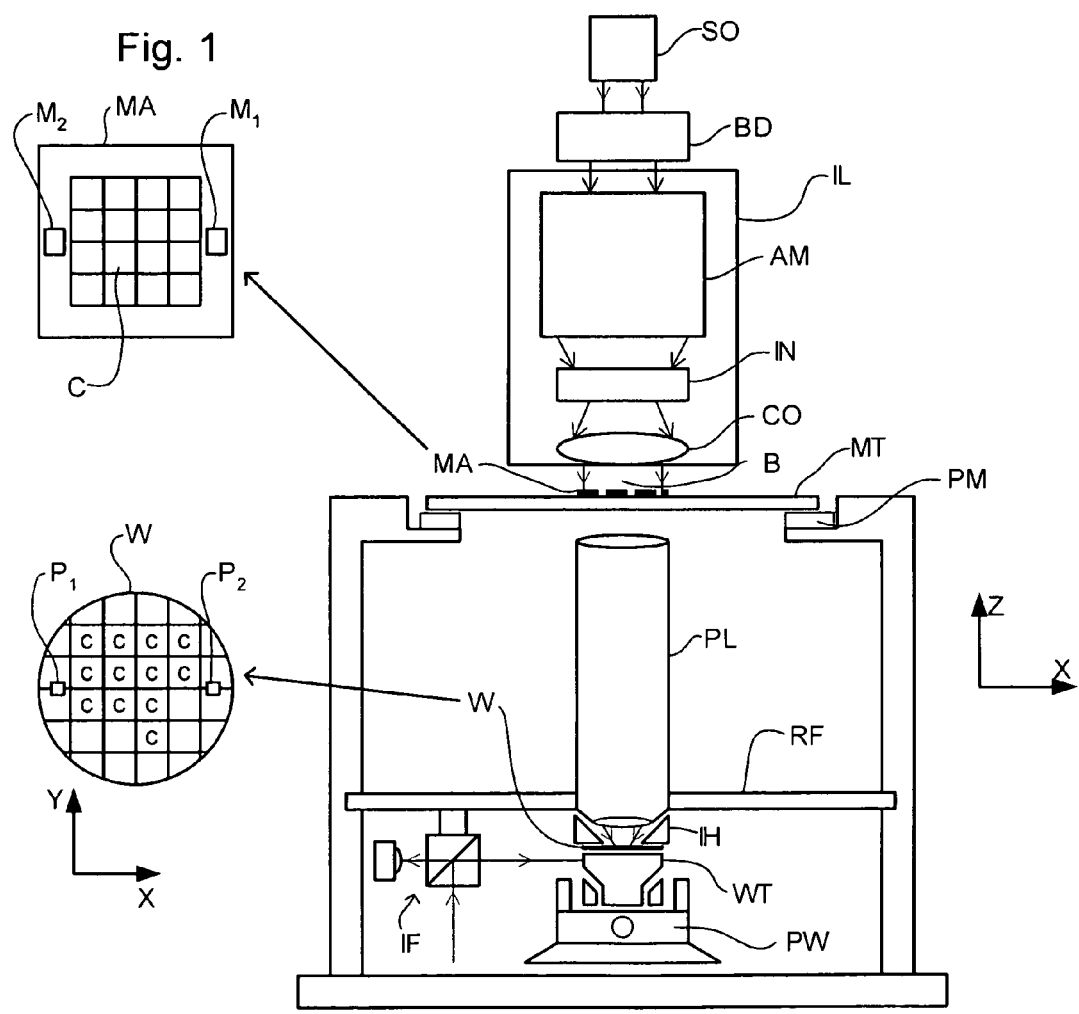
FIG. 1 depicts a lithographic apparatus according to an embodiment of the invention.
Figure 5:
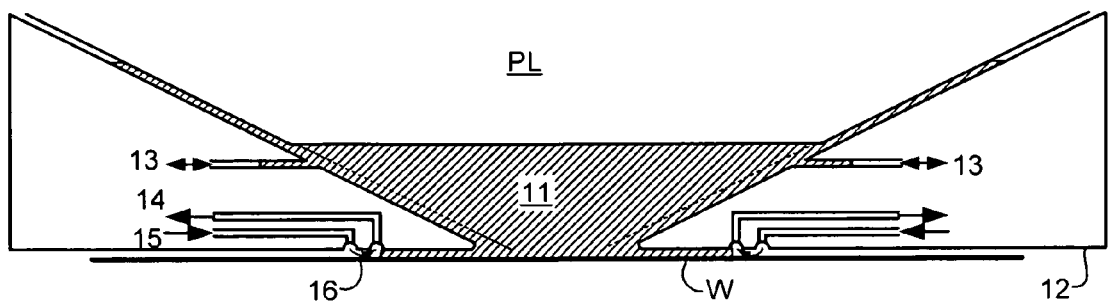
FIG. 5 depicts a barrier member for use in an immersion lithographic apparatus.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 6:
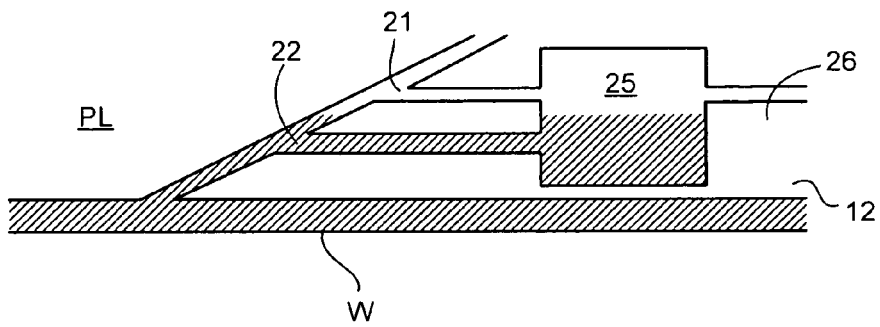
FIG. 6 depicts an embodiment of the invention with a low level of immersion liquid.

As shown in FIG. 6 there are a plurality of conduits, 21, 22 arranged in the barrier member 12 around the projection system PL. Each of the conduits 21, 22 is arranged at a different position in the barrier member 12, in particular at a different level in the barrier member 12, and leads to a common chamber 25. As depicted in FIG. 6, conduit 21 is located above conduit 22. A passage 26 leads from the chamber 25. FIG. 6 shows a lithographic apparatus with a low level of immersion liquid. In this situation only the lower conduit 22 is in contact with the immersion liquid and is filled with immersion liquid whereas the upper conduit 21 is substantially free of immersion liquid. Suction is applied to the passage 26. As the conduit 21 is substantially free of immersion liquid mainly gas will be drawn through conduit 21 into the chamber 25 and through passage 26. Thus liquid flow through conduit 22 is substantially zero because there is substantially no pressure drop. In contrast, in the lithographic apparatus depicted in FIG. 7 the level of the immersion liquid is located above the level of the upper conduit 21. There is therefore a low pressure in chamber 25 and the suction applied to the passage 26 extracts immersion liquid from the apparatus through both conduits 21 and 22. When sufficient immersion liquid has been extracted to reduce the immersion liquid level below the level of the upper conduit 21 the liquid extraction capacity drops because there is substantially no pressure drop and gas begins to flow through the upper conduit 21. It should be noted that the suction applied to passage 26 is substantially constant but the liquid extraction capacity varies due to the contents of the conduits. When at least one of the conduits does not contain immersion liquid, the liquid extraction capacity will drop due to the suction of gas as there is only one conduit available to extract liquid. Thus when the level of the immersion liquid rises above the level of the upper conduit 21 the liquid extraction capacity increases until the excess immersion liquid is removed. It is therefore possible to vary the liquid extraction capacity of the apparatus according to the level of the immersion liquid to compensate for varying levels of the immersion liquid. In particular the level of the immersion liquid can be controlled in a passive manner. Advantageously a relatively large extraction flow may be achieved using this apparatus.

Figure 7:
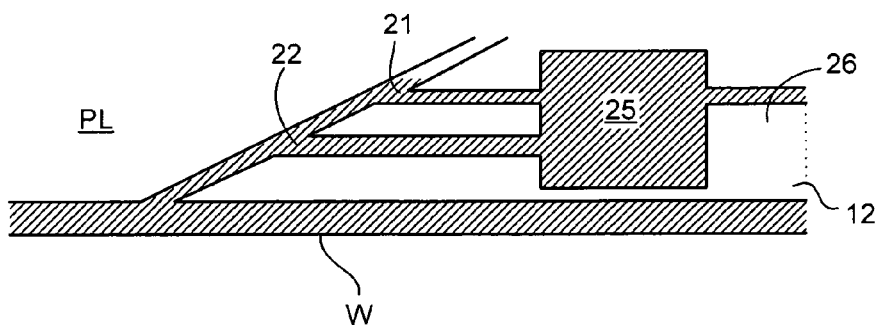
FIG. 7 depicts the embodiment shown in FIG. 6 with a high level of immersion liquid.
Figure 8:
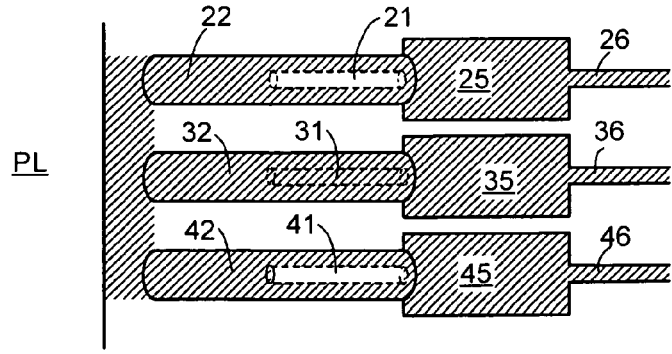
FIG. 8 depicts a plan view of the embodiment depicted in FIGS. 6 and 7.

FIG. 8 shows a top plan view of the apparatus shown in FIGS. 6 and 7 wherein there are a plurality of liquid removal systems 25, 35, 45 provided adjacent to each other. Each liquid removal system has an upper conduit 21, 31, 41, a lower conduit 22, 32, 42, a chamber 25, 35, 45 and passages 26, 36, 46. The liquid removal systems are arranged around the projection system PL. The meniscus level may vary around the projection system and thus some upper conduits 21, 31, 41 may be submerged whereas others may comprise gas. Thus the level of the immersion liquid or meniscus position can be controlled around the entire projection system.

Although this embodiment shows only two conduits (e.g., 21, 22) in each liquid removal system there could be three, four or more arranged above each other and the suction capacity would depend on how many conduits are submerged.

As gas flows faster through the upper conduit 21 than immersion liquid through the lower conduit 22 the upper conduit 21 may have a smaller cross-section than the lower conduit 22. This will help reduce or minimize gas flow and thus vibration. Indeed the upper conduit 21 may have a cross sectional area 20 to 100 times smaller than the lower conduit 22.

Figure 9:
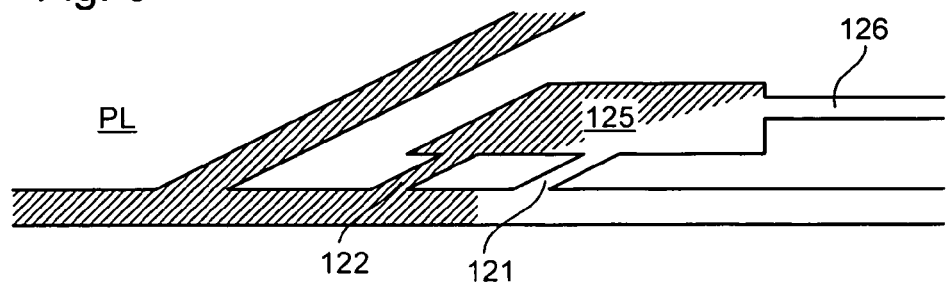
FIG. 9 depicts an embodiment of the invention.
Figure 10:
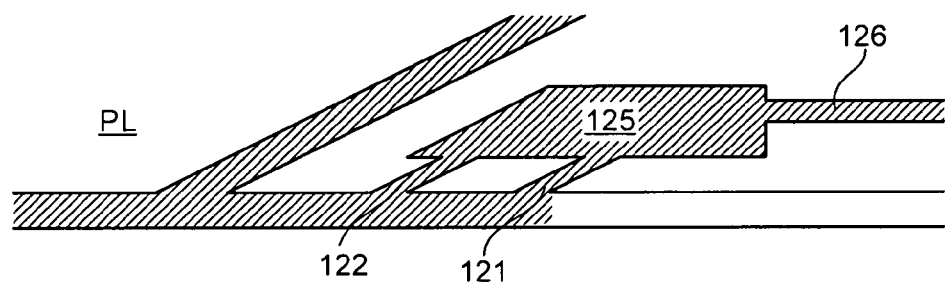
FIG. 10 depicts another view of the embodiment depicted in FIG. 9.
Figure 11:
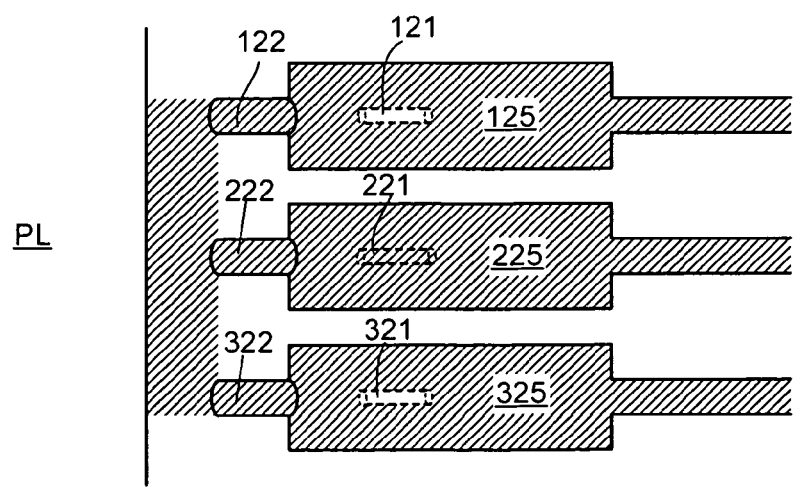
FIG. 11 depicts a plan view of the embodiment depicted in FIGS. 9 and 10.

FIGS. 9 to 11 depict an embodiment in which first and second conduits 121, 122 are arranged at different distances from the projection system PL. When the immersion liquid fills both conduits 121, 122 the extraction capacity is relatively high but when the immersion liquid fills only one, or indeed none of the extraction conduits the liquid extraction capacity is reduced. Thus when there is excess immersion liquid the liquid extraction capacity is higher than when there is less immersion liquid. As shown in FIG. 11, a plurality of liquid removal systems 25, 35, 45 may be provided arranged around the projection system PL. Each liquid removal system has a first conduit 121, 221, 321, a second conduit 122, 222, 322, a chamber 125, 225, 325 and passages.

Again conduits arranged further from the projection system PL can be narrower in diameter than those closer to the projection system PL.

As will be apparent, one or more features of one or more of the embodiments may be combined with or used alternatively with one or more features of one or more other of embodiments.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
   a projection system configured to project a patterned beam of radiation into an image field, the image field having a center;
   a substrate table constructed to position a target portion of a substrate in the image field;
   a liquid supply system constructed to supply a space between the projection system and the substrate table with liquid; and
   a barrier member configured to extend along at least part of the space between the projection system and the substrate, the barrier member comprising a first external surface extending generally horizontally and a second external surface extending at an angle to horizontal, and the barrier member comprising a liquid extraction system, comprising:
   a passage configured to be subjected to a suction from a suction source, and
   a plurality of conduits directly fluidly connected in parallel between the passage and respective openings of the conduits to remove liquid from the space, the openings of the conduits arranged in the first external surface or in the second external surface of the barrier member and the openings arranged in the respective surface at different distances from the center of the image field.

2. The apparatus of claim 1, wherein the plurality of openings of the conduits are arranged at different radial distances from the center of the image field.

3. The apparatus of claim 2, wherein a cross-sectional area of a conduit is less than a cross-sectional area of a conduit with its opening arranged radially closer to the center of the image field.

4. The apparatus of claim 1, wherein there are a plurality of liquid extraction systems arranged around the projection system.

5. The apparatus of claim 1, wherein each of the plurality of conduits and the passage is connected to a chamber.

6. The apparatus of claim 5, wherein the passage is located at substantially the same or further distance from the center of the image field as the opening of a conduit of the plurality of conduits.

7. A device manufacturing method, comprising:
   projecting a projection beam of radiation using a projection system into an image field having a center;
   placing a target portion of a substrate in the image field;
   supplying liquid to a space between the projection system and the substrate;
   at least partly confining the liquid in the space using a barrier member extending along at least part of the space, the barrier member comprising a first external surface extending generally horizontally and a second external surface extending at an angle to horizontal; and providing suction, from a suction source, to remove liquid from the space, the suction operating through respective openings of a plurality of conduits, the conduits directly fluidly connecting the space to a passage in parallel and the openings arranged in the first external surface or in the second external surface of the barrier member and the openings arranged in the respective surface at different distances from the center of the image field.

8. The method of claim 7, wherein the openings of the plurality of conduits are arranged at different radial distances from the center of the image field.

9. The method of claim 8, wherein a cross-sectional area of a conduit is less than a cross-sectional area of a conduit with its opening arranged radially closer to the center of the image field.

10. The method of claim 7, wherein each of the plurality of conduits and the passage is connected to a chamber.

11. The method of claim 10, wherein the passage is located at substantially the same or further distance from the center of the image field as the opening of a conduit of the plurality of conduits.

12. A lithographic projection apparatus, comprising:
a projection system configured to project a patterned beam of radiation into an image field;
a substrate table constructed to position a target portion of a substrate in the image field;
a liquid supply system constructed to supply a space between the projection system and the substrate table with liquid; and
a barrier member configured to extend along at least part of the space between the projection system and the substrate, the barrier member comprising a first external surface extending generally horizontally and a second external surface extending at an angle to horizontal, and the barrier member comprising a liquid extraction system, comprising:
a passage configured to be subjected to a suction from a suction source; and
a plurality of conduits connected in parallel between the passage and the space to remove liquid from the space, each conduit having an opening defined in a same external surface of the barrier member, the same external surface being of the first external surface or of the second external surface of the barrier member and each opening arranged in the respective first or second external surface at a different height relative to the image field.

13. The apparatus of claim 12, wherein a cross-sectional area of a first conduit of the plurality of conduits is less than a cross-sectional area of a second conduit of the plurality of conduits with its opening arranged below the opening of the first conduit in relation to the substrate table.

14. The apparatus of claim 12, wherein there are a plurality of liquid extraction systems arranged around the projection system.

15. The apparatus of claim 12, wherein each of the plurality of conduits and the passage is connected to a chamber.

16. The apparatus of claim 15, wherein the passage is located at substantially the same or further height relative to the image field as the opening of a conduit of the plurality of conduits.

17. A device manufacturing method, comprising:
projecting a projection beam of radiation onto a target portion of a substrate using a projection system;
supplying liquid to a space between the projection system and the substrate;
at least partly confining the liquid in the space using a barrier member extending along at least part of the space, the barrier member comprising a first external surface extending generally horizontally and a second external surface extending at an angle to horizontal; and
providing suction, from a suction source, to remove liquid from the space, the suction operating through a plurality of conduits connected to a passage in parallel, each conduit having an opening defined in a same external surface of the barrier member, the same external surface being of the first external surface or of the second external surface of the barrier member and each opening arranged in the respective first or second external surface at a different height.

18. The method of claim 17, wherein a cross-sectional area of a first conduit of the plurality of conduits is less than a cross-sectional area of a second conduit of the plurality of conduits with its opening arranged below the opening of the first conduit in relation to the substrate table.

19. The method of claim 17, wherein each of the plurality of conduits and the passage is connected to a chamber.

20. The method of claim 19, wherein the passage is located at substantially the same or further height as the opening of a conduit of the plurality of conduits.

* * * * *